United States Patent
Kuroki et al.

(10) Patent No.: US 8,217,643 B2
(45) Date of Patent: Jul. 10, 2012

(54) CURRENT DETECTOR AND WATTMETER USING THE SAME

(75) Inventors: Yuta Kuroki, Kawasaki (JP); Fuyuki Kurokawa, Yokohama (JP); Mitsuhiro Sakoyama, Yokohama (JP)

(73) Assignee: Toshiba Toko Meter Systems Co., Ltd., Tokyo (JP)

( * ) Notice: Subject to any disclaimer, the term of this patent is extended or adjusted under 35 U.S.C. 154(b) by 30 days.

(21) Appl. No.: 12/922,700

(22) PCT Filed: Feb. 26, 2009

(86) PCT No.: PCT/JP2009/053495
§ 371 (c)(1),
(2), (4) Date: Sep. 15, 2010

(87) PCT Pub. No.: WO2009/119238
PCT Pub. Date: Oct. 1, 2009

(65) Prior Publication Data
US 2011/0012590 A1    Jan. 20, 2011

(30) Foreign Application Priority Data
Mar. 24, 2008    (JP) .............................. P2008-076274

(51) Int. Cl.
*G01R 33/07*    (2006.01)
(52) U.S. Cl. ................. 324/117 H; 324/117 R; 324/142
(58) Field of Classification Search ............... 324/117 H
See application file for complete search history.

(56) References Cited

U.S. PATENT DOCUMENTS

| | | | |
|---|---|---|---|
| 4,559,495 A * | 12/1985 | Lienhard | 324/117 R |
| 4,749,940 A * | 6/1988 | Bullock | 324/127 |
| 4,894,610 A * | 1/1990 | Friedl | 324/127 |
| 5,642,041 A * | 6/1997 | Berkcan | 324/127 |
| 6,130,599 A * | 10/2000 | Juds et al. | 338/32 H |
| 7,091,878 B2 * | 8/2006 | Holle et al. | 340/870.02 |
| 7,493,222 B2 * | 2/2009 | Bruno | 702/64 |
| 7,612,553 B2 * | 11/2009 | Kinzel | 324/117 H |
| 2003/0039062 A1 | 2/2003 | Takahasahi | |

FOREIGN PATENT DOCUMENTS

| | | | |
|---|---|---|---|
| DE | 195 49 181 | | 7/1997 |
| JP | 5 223849 | | 9/1993 |
| JP | 2001 35345 | | 2/2001 |
| JP | 2003 69107 | | 3/2003 |
| JP | 2007-183221 | * | 7/2007 |
| JP | 2007 183221 | | 7/2007 |

OTHER PUBLICATIONS

Japanese Office Action issued Nov. 30, 2011, in Patent Application No. 10-2010-7019399 (with Partial English-language translation).
Indonesian Office Action issued Mar. 2, 2012, in Patent Application No. W-00201003244.

* cited by examiner

*Primary Examiner* — Richard Isla Rodas
(74) *Attorney, Agent, or Firm* — Oblon, Spivak, McClelland, Maier & Neustadt, L.L.P.

(57) ABSTRACT

A current detector includes a plate conductor (4) that is folded in one portion in a longitudinal direction to have two parts parallel to and facing each other having a predetermined width (w1) therebetween, so as to compose a looped current path (2a) in the conductor, and a magneto-electric transducer (2) that is placed between the two parts of the conductor (4; 4a, 4b) so that a magnetic sensing axis is parallel to a width direction of the conductor (4), of which a length (a) in a direction of the magnetic sensing axis is smaller than the width (w1) of the conductor.

4 Claims, 8 Drawing Sheets

MAGNETIC FIELD DIRECTION (MAGNETIC SENSING DIRECTION)

MAGNETIC FIELD DIRECTION (MAGNETIC SENSING DIRECTION)

FIG. 6
(a)
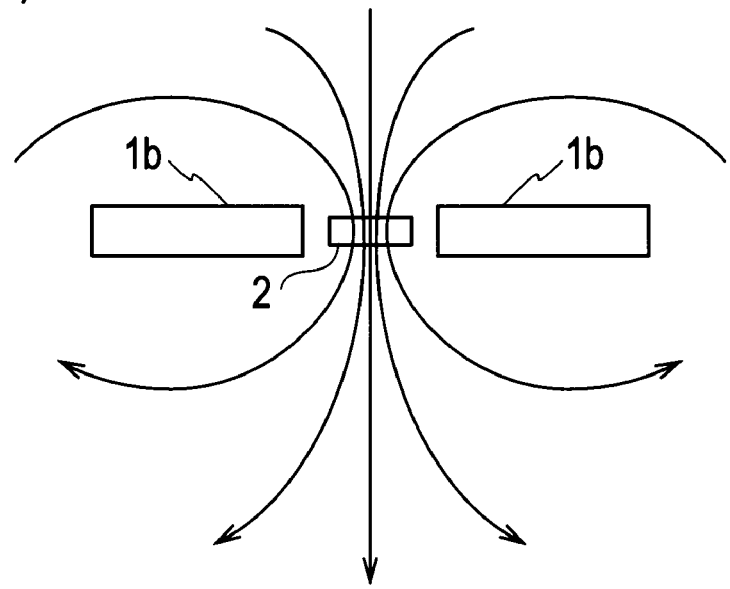
(b)
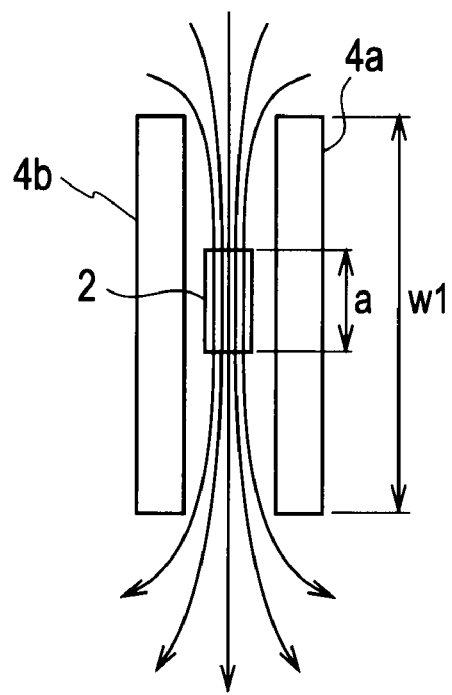

● IS A MAGNETIC SENSING SURFACE

CURRENT DETECTOR AND WATTMETER USING THE SAME

TECHNICAL FIELD

The present invention relates to a current detector for detecting a magnitude of current flowing in a conductor due to magneto-electric conversion, and also relates to a wattmeter using the current detector.

BACKGROUND ART

In a conventional electric wattmeter, a current detector including a magneto-electric transducer as illustrated in FIG. 1 is used in a current measurement unit (see PTL 1). The current detector includes a conductor 1 to form a looped current path 1b, a magneto-electric transducer 2 provided in the center of the looped current path 1b so as to pass a magnetic flux F therethrough, in which the magnetic flux F is generated by a current to be detected I flowing in the current path 1b, and a ferromagnetic body 3 for collecting the magnetic flux F around the magneto-electric transducer 2.

The configuration of the current detector is simple, and a method of fixing the magneto-electric transducer to the current detector is not complicated. Thus, manufacturing costs can be reduced. The current detector uses the magneto-electric transducer in order to detect current. Therefore, a primary side and a secondary side of the current detector are electrically insulated from each other. Accordingly, the current detector can also function to protect a circuit connected to the secondary side of the current detector.

CITATION LIST

Patent Literature
[PTL 1] Japanese Patent Laid-Open Publication No. H05-223849.

SUMMARY OF INVENTION

However, the conventional current detector may not measure a magnitude of current accurately because of mutual interference of magnetic fields generated by current to be detected flowing in conductors adjacent to each other, an influence of an external noise, and a shift in position of the magneto-electric transducer over time, for example.

In addition, providing the ferromagnetic body in the current detector and increasing the number of turns of a coil in order to improve detection sensitivity may cause the current detector to increase in size and result in a high cost.

The present invention has been made in order to solve the above-mentioned problems. An object of the present invention is to provide a small and inexpensive current detector and a wattmeter using the current detector that can measure a magnitude of current accurately.

To achieve the above-mentioned object, a first aspect of the present invention provides a current detector, including: a plate conductor that is folded in one portion in a longitudinal direction to have two parts parallel to and facing each other having a predetermined width therebetween, so as to compose a looped current path in the conductor; and a magneto-electric transducer that is placed between the two parts of the conductor so that a magnetic sensing axis parallel to a width direction of the conductor, of which a length in a direction of the magnetic sensing axis is smaller than the width of the conductor.

According to the current detector of the first aspect of the present invention, a density of a magnetic flux is high and uniform in a magnetic sensing surface of the magneto-electric transducer since the length of the magneto-electric transducer in the magnetic sensing axis direction is much shorter than the width of an upper conductor and a lower conductor of the conductor. Therefore, the detection sensitivity is improved compared with the conventional current detector. Accordingly, the accurate measurement of the current can be achieved. Moreover, the small current detector can be manufactured inexpensively.

A second aspect of the present invention provides a current detector, comprising: a U-shaped plate conductor composed of a first conductor that is folded in one portion in a longitudinal direction to have two parts parallel to and facing each other having a predetermined width therebetween, so as to compose a first looped current path in the first conductor, and a second conductor that is connected to the first conductor and folded in one portion in a longitudinal direction to have two parts parallel to and facing each other having a predetermined width therebetween, so as to compose a second looped current path in the second conductor; a first magneto-electric transducer that is placed between the two parts of the first conductor so that a magnetic sensing axis is parallel to a width direction of the first conductor, of which a length in a direction of the magnetic sensing axis is smaller than the width of the first conductor; and a second magneto-electric transducer that is placed between the two parts of the second conductor so that a magnetic sensing axis is parallel to a width direction of the second conductor, of which a length in a direction of the magnetic sensing axis is smaller than the width of the second conductor, the second magneto-electric transducer being connected in series to the first magneto-electric transducer.

According to the current detector of the second aspect of the present invention, the first magneto-electric transducer is placed between the two parts of the first conductor facing each other composing the first current path, and the second magneto-electric transducer is placed between the two parts of the second conductor facing each other composing the second current path. The first magneto-electric transducer and the second magneto-electric transducer are connected in series. Thus, detection sensitivity can be improved due to the above-described configuration.

According to the current detector of the second aspect of the present invention, the second magneto-electric transducer is preferably connected to the first magneto-electric transducer so that the second magneto-electric transducer has an opposite polarity to a polarity of the first magneto-electric transducer.

Due to such a configuration, the detection sensitivity is improved, and the current detector is not influenced by an external magnetic field.

According to the current detector of the second aspect of the present invention, the magnetic sensing axes of the first magneto-electric transducer and the second magneto-electric transducer are preferably on the same axis.

Due to such a configuration, mutual interference between the magneto-electric transducers can be eliminated, thereby improving detection sensitivity.

A third aspect of the present invention provides a wattmeter, comprising: a current measurement unit that measures current; a voltage measurement unit that measures voltage; an electricity calculator that calculates electricity based on the current measured by the current measurement unit and the voltage measured by the voltage measurement unit; and an output unit that outputs the electricity calculated by the electricity calculator. The current measurement unit is composed of a current detector, which includes a plate conductor that is folded in one portion in a longitudinal direction to have two parts parallel to and facing each other having a predetermined width therebetween, so as to have a looped current path in the conductor, and a magneto-electric transducer that is placed between the two parts of the conductor so that a magnetic sensing axis is parallel to a width direction of the conductor, of which a length in a direction of the magnetic sensing axis is smaller than the width of the conductor.

The wattmeter according to the third aspect of the present invention uses the current detector according to the first aspect of the present invention. Accordingly, detection sensitivity can be improved compared with the conventional current detector, a measurement of current can be performed accurately, and a small and inexpensive configuration can be achieved.

BRIEF DESCRIPTION OF DRAWINGS

FIG. 6 illustrates a comparison of an effect obtained by the current detector according to Example 1 of the present invention with an effect obtained by a conventional current detector.

DESCRIPTION OF EMBODIMENTS

Figure 1:
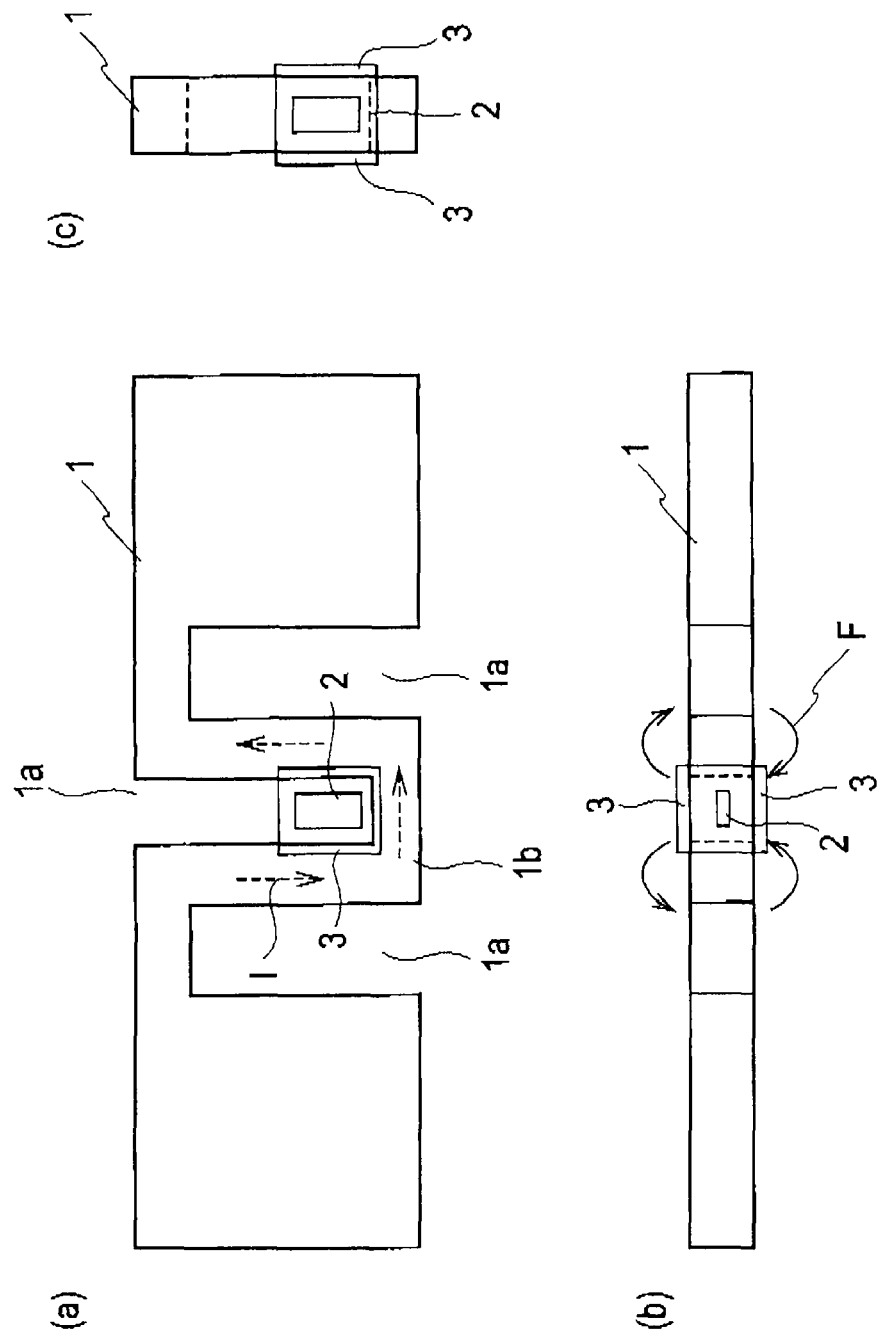
FIG. 1 is an explanatory view of a current detector used in a conventional electronic wattmeter.

Hereinafter, embodiments of the present invention will be described with reference to the drawings. Elements in the embodiments corresponding to the elements of the conventional current detector described in Background Art are indicated by the same reference numerals as those used in Background Art.

EXAMPLE 1

Figure 2:
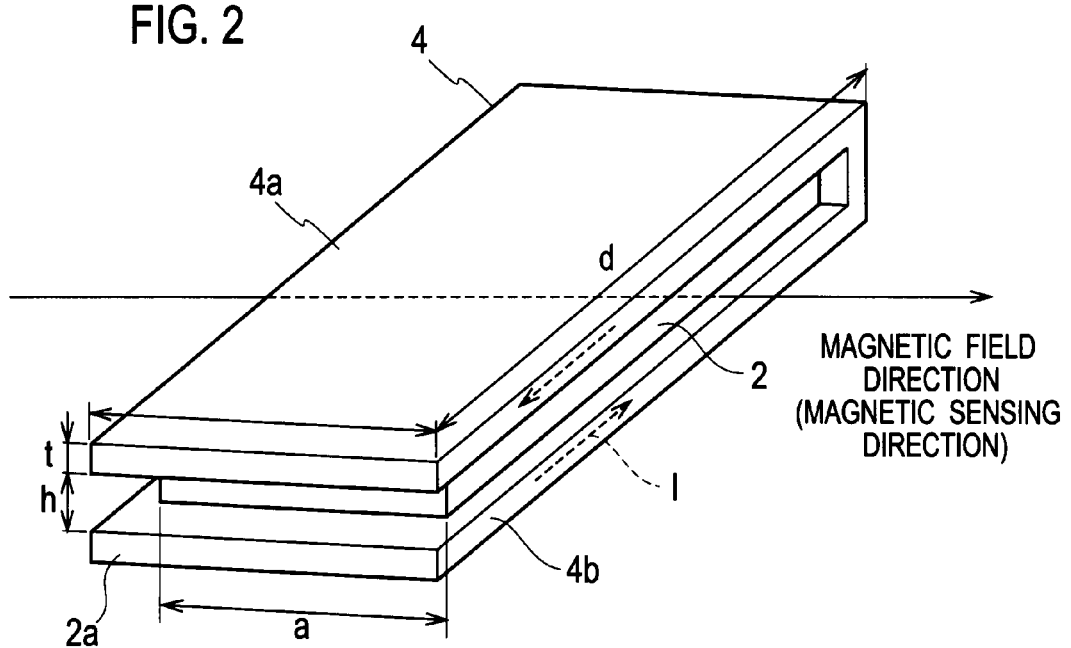
FIG. 2 is an external perspective view of a current detector according to Example 1 of the present invention.

A current detector according to Example 1 of the present invention illustrated in FIG. 2 includes a plate-like conductor 4 having a predetermined width w1 is folded approximately in the middle in a longitudinal direction so as to have an upper conductor 4a and a lower conductor 4b parallel to and facing each other having a gap h therebetween. Thus, a current path 2a formed into a loop (hereinafter, referred to as a looped current path) is obtained in the conductor 4. Alternatively, a method of cutting in the conductor 4 may be used to form the looped current path.

A magneto-electric transducer 2 is placed in a center portion in the gap between the upper conductor 4a and the lower conductor 4b, namely in a center portion of the looped current path 2a. The magneto-electric transducer 2 is to have detection sensitivity with respect to a direction of a magnetic field (a right direction in FIG. 2) that is generated by a flow of the current to be detected I in the looped current path 2a. In other words, the magneto-electric transducer 2 is positioned so that a magnetic sensing axis of the magneto-electric transducer 2 is parallel to a width direction of the upper conductor 4a and the lower conductor 4b. Although the magneto-electric transducer 2 has an intentionally long length "a" in the magnetic sensing axis direction in the figure, the actual length of the magneto-electric transducer 2 is much shorter than the width w1 of the upper conductor 4a and the lower conductor 4b.

Figure 3:
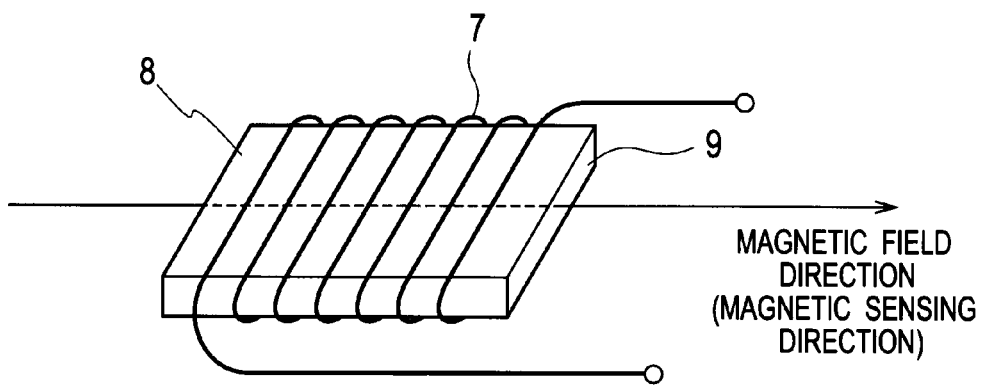
FIG. 3 illustrates a magneto-electric transducer used in the current detector according to Example 1 of the present invention.
Figure 4:
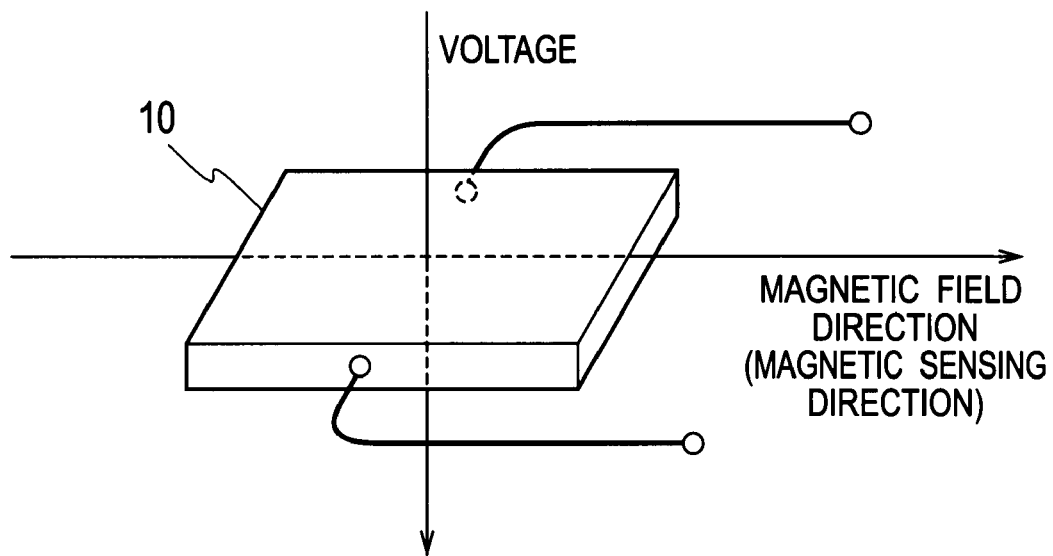
FIG. 4 illustrates another magneto-electric transducer used in the current detector according to Example 1 of the present invention.

As illustrated in FIG. 3, the magneto-electric transducer 2 is composed of a magnetic core 8 and a coil 7 that is wound on the magnetic core 8, for example. The magneto-electric transducer 2 detects an interlinked magnetic flux on a magnetic sensing surface 9 (a surface perpendicular to the magnetic sensing axis) of the magnetic core 8, and outputs current corresponding to a density of the magnetic flux. The magneto-electric transducer 2 may be substituted for a hall element 10 illustrated in FIG. 4.

Figure 5:
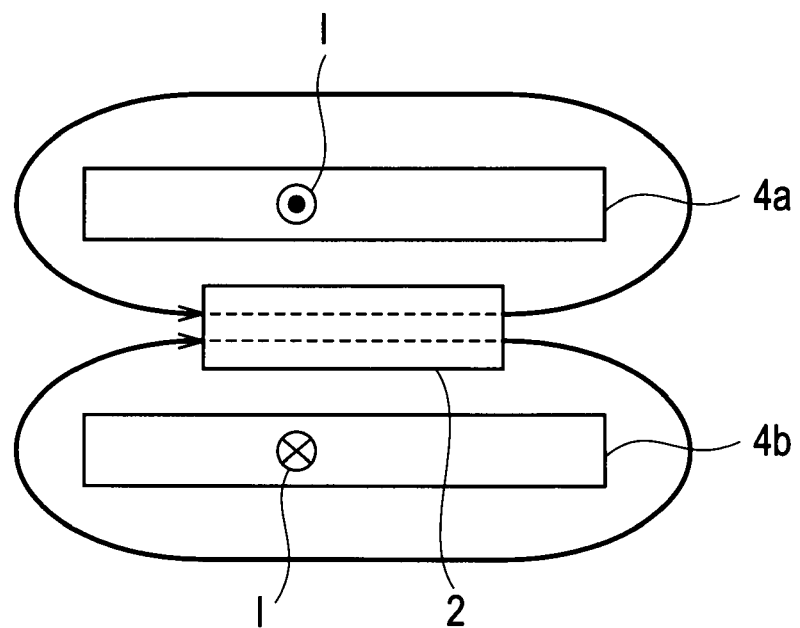
FIG. 5 is an explanatory view of a mechanism of the current detector according to Example 1 of the present invention.

In the current detector according to Example 1 described above, the current to be detected I flows in the looped current path 2a in a direction from the lower conductor 4b to the upper conductor 4a, as illustrated in FIG. 2 and FIG. 5. Due to such a configuration, a summation magnetic flux of magnetic fluxes generated in the upper conductor 4a and the lower conductor 4b passes through the magneto-electric transducer 2 in a direction from left toward right in FIG. 5.

Accordingly, detection sensitivity of the current detector according to Example 1 is improved in comparison with a general current detector, in which a magneto-electric transducer detects a magnetic flux generated by a unidirectional flow of current to be detected in a linear current path composed of a linear conductor.

Moreover, since the magneto-electric transducer 2 has the length "a" in the magnetic sensing axis direction much shorter than the width w1, the functions and effects as described below can be achieved.

FIG. 6(a) illustrates a magnetic field generated in a conventional current detector. In the conventional current detector, a length of the magneto-electric transducer 2 in the magnetic sensing axis direction is not short enough with respect to a thickness of a conductor 1b to achieve sufficient detection sensitivity. As a result, a magnetic flux is widened in the magnetic sensing surface of the magneto-electric transducer 2, and a density of the magnetic flux on the magnetic sensing surface is reduced.

On the other hand, in the current detector according to Example 1, the length a of the magneto-electric transducer 2 in the magnetic sensing axis direction is much shorter than the width w1 of the upper conductor 4a and the lower conductor 4b. Therefore, the density of the magnetic flux becomes homogeneous and high on the magnetic sensing surface of the magneto-electric transducer 2. Accordingly, the detection sensitivity in the current detector according to Example 1 is improved compared with the conventional current detector. Moreover, even when a position of the magneto-electric transducer 2 is shifted in the magnetic sensing axis direction, positional precision of the magneto-electric transducer 2 can be maintained since output of the magneto-electric transducer 2 does not change.

Since the length "a" of the magneto-electric transducer 2 in the magnetic sensing axis direction is much shorter than the width w1 of the upper conductor 4a and the lower conductor 4b as described above, the plural magneto-electric transducers 2 can be arranged in the current detector according to Example 1. By arranging the plural magneto-electric transducers 2 in the current detector, a high-output detection signal can be obtained.

The conductor 4 described above is to have the width w1 of 12 mm and a thickness t of 1 mm, for example, in view of a prevention of deformation and heat generation of the conductor 4 in the case where current at 60 amperes that is the maximum value of the current to be detected I (rated amperes of a common wattmeter) flows in the conductor 4. Due to such a width and thickness, a current density through the conductor 4 is increased, and the magnetic flux passing through the magneto-electric transducer 2 is increased. Consequently, the detection sensitivity of the magneto-electric transducer 2 is improved.

As a experimental result made by the inventors of the present invention, it was confirmed that a uniformity of the magnetic flux passing through the magneto-electric transducer 2 could be achieved by setting a cut length d of the looped current path 2a to 40 mm and the gap h of the looped current path 2a to 2.5 mm. Due to such dimensions in the looped current path 2a, the uniformity of the magnetic flux passing through the magneto-electric transducer 2 is achieved. Moreover, since an output fluctuation of the magneto-electric transducer 2 according to a positional shift of the magneto-electric transducer 2 in a gap direction of the conductor 4 is prevented, the positional precision of the magneto-electric transducer 2 can be maintained.

Figure 7:
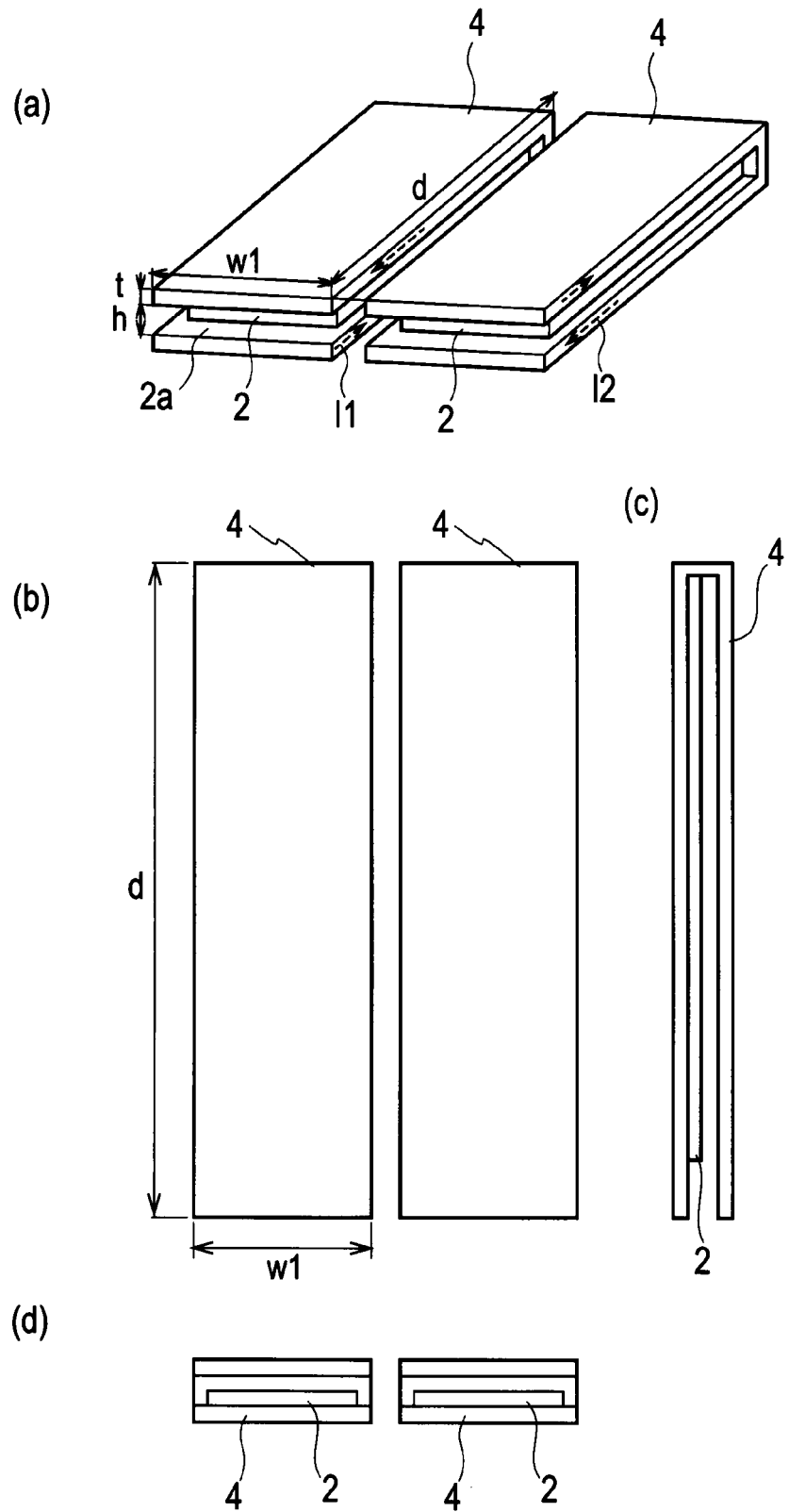
FIG. 7 illustrates a case where the plural current detectors according to Example 1 of the present invention are arranged parallel to each other.

The plural current detectors according to Example 1 described above may be arranged parallel to each other principally in order to detect current to be detected in two current paths concurrently. FIG. 7 illustrates the current detectors arranged parallel to each other. FIG. 7(a) is an external perspective view, FIG. 7(b) is a plan view, FIG. 7(c) is a side view, and FIG. 7(d) is a front view.

Figure 8:
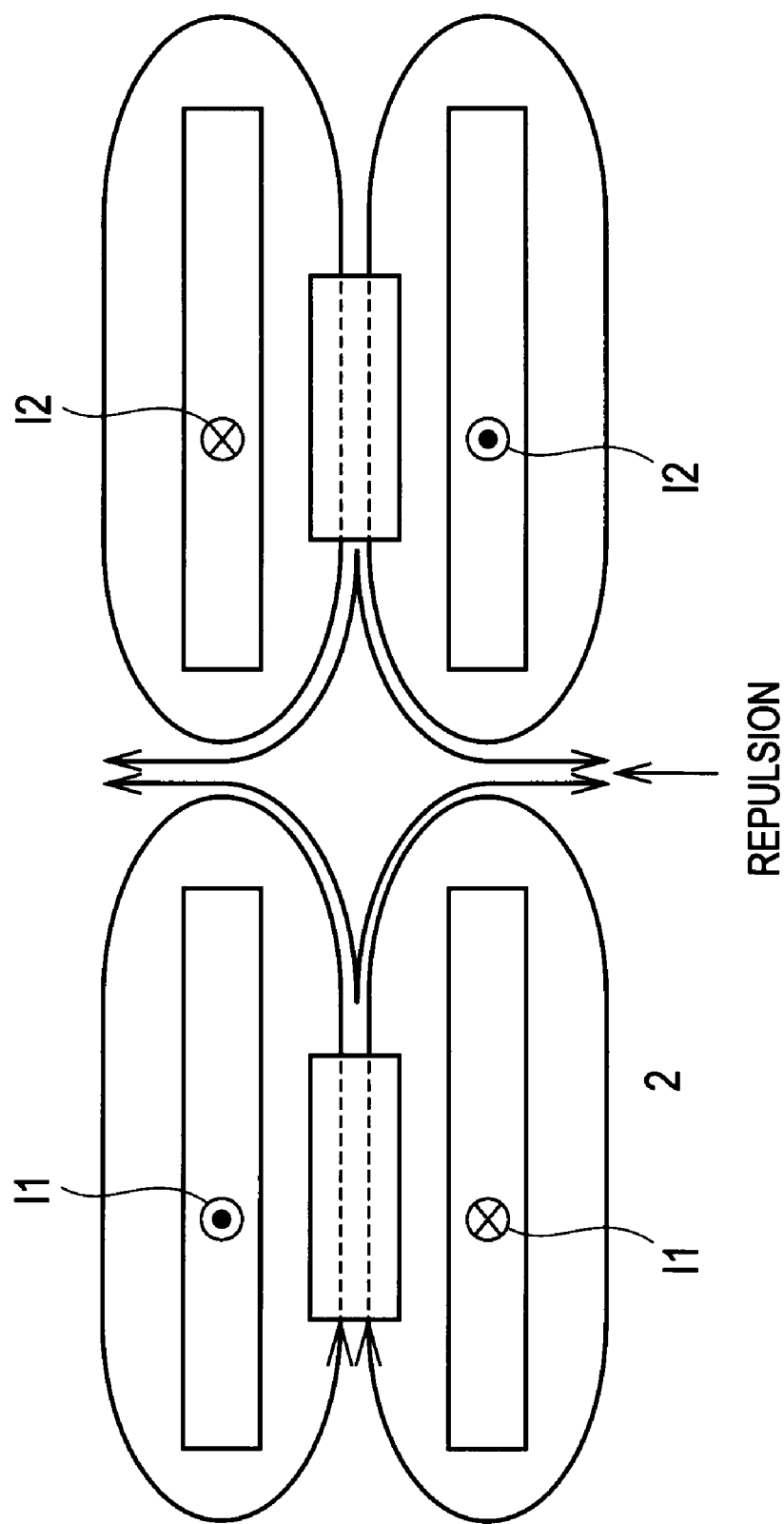
FIG. 8 is an explanatory view of a mechanism in the case where the plural current detectors according to Example 1 of the present invention are arranged parallel to each other.

In the case of Example 1, by using the plural conductors 4 having the same configuration, a leakage of the magnetic flux is reduced. Therefore, even when the two current detectors are located adjacent to each other to measure current to be detected in two positions, there is little interference between the current detectors. As illustrated in FIGS. 7 and 8, when the two current detectors are aligned closely, a phase of a current to be detected I1 in one current detector is preferably opposed to a phase of a current to be detected I2 in the other current detector. Thus, a repulsion of the magnetic fields is caused between one current detector and the other current detector. Accordingly, the mutual interference between the current detectors can be further reduced.

EXAMPLE 2

Figure 9:
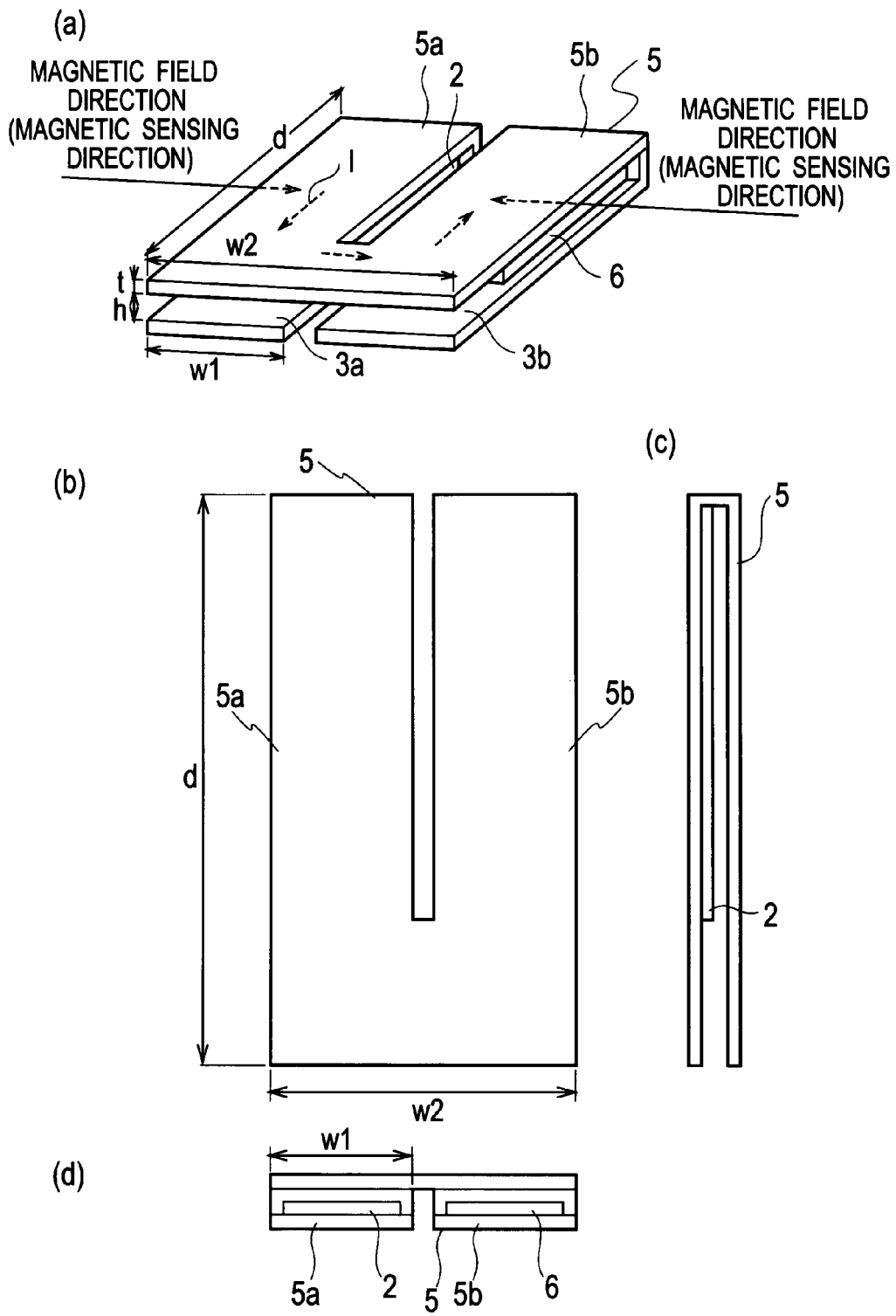
FIG. 9 illustrates a configuration of a current detector according to Example 2 of the present invention.

FIG. 9 illustrates a configuration of a current detector according to Example 2 of the present invention. FIG. 9(a) is an external perspective view, FIG. 9(b) is a plan view, FIG. 9(c) is a side view, and FIG. 9(d) is a front view. The current detector according to Example 2 of the present invention illustrated in FIG. 2 includes a U-shaped plate-like conductor 5 having a predetermined width w2. The conductor 5 is folded approximately in the middle in a longitudinal direction so as to have an upper conductor and a lower conductor parallel to and facing each other having the gap h therebetween. Thus, a first looped current path 3a is formed in a first conductor 5a having a predetermined width w1. Similarly, a second looped current path 3b is formed in a second conductor 5b having the predetermined width w1.

The U-shaped plate-like conductor 5 is folded in half so as to form the first conductor 5a and the second conductor 5b, which are connected with each other at a bottom portion of a "U" shape in the conductor 5. Each of the first conductor 5a and the second conductor 5b has a configuration (e.g. dimension) corresponding to the conductor of the current detector in Example 1.

A method of cutting in the conductor 5 may be used to form the "U" shape and the first conductor 5a and the second conductor 5b in the conductor 5.

A first magneto-electric transducer 2 is placed in a center portion in the gap between the upper conductor and the lower conductor of the first conductor 5a, namely in a center portion of a first looped current path 3a. Similarly, a second magneto-electric transducer 6 is placed in a center portion in the gap between the upper conductor and the lower conductor of the second conductor 5b, namely in a center portion of a second looped current path 3b.

The first magneto-electric transducer 2 is to have detection sensitivity with respect to a direction of a magnetic field (a right direction in FIG. 9(a)) that is generated by a flow of current in the first looped current path 3a. In other words, the first magneto-electric transducer 2 is positioned so that a magnetic sensing axis thereof is parallel to a width direction of the first conductor 5a, and a direction of the magnetic sensing axis is parallel to the direction of the magnetic field. Similarly, the second magneto-electric transducer 6 is to have detection sensitivity with respect to a direction of a magnetic field (a left direction in FIG. 9(a)) that is generated by a flow of current in the second looped current path 3b. In other words, the second magneto-electric transducer 6 is positioned so that a magnetic sensing axis thereof is parallel to a width direction of the second conductor 5b, and a direction of the magnetic sensing axis is parallel to the direction of the magnetic field. Namely, the direction of the magnetic sensing axis of the second magneto-electric transducer 6 is opposite to the direction of the first magneto-electric transducer 2.

Figure 10:
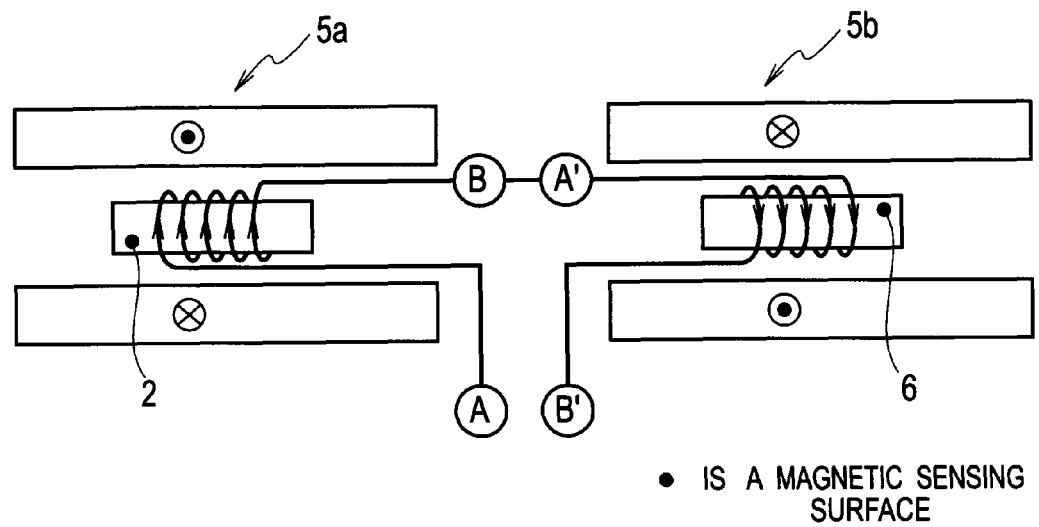
FIG. 10 illustrates a connection between a first magneto-electric transducer and a second magneto-electric transducer used in the current detector according to Example 2 of the present invention.

Each length of the first magneto-electric transducer 2 and the second magneto-electric transducer 6 in each magnetic sensing axis direction is much shorter than the width w1 of the upper conductor and the lower conductor of each magneto-electric transducer. As illustrated in FIG. 10, the first magneto-electric transducer 2 and the second magneto-electric transducer 6 are connected in series with each other so that the magnetic sensing axis directions (magnetic sensing surface positions indicated by black circles in FIG. 10) of the respective magneto-electric transducers are opposed to each other. In other words, the first magneto-electric transducer 2 and the second magneto-electric transducer 6 are connected in series with each other so that each magneto-electric transducer has an opposite polarity.

Similarly to the current detector in Example 1, each of the first magneto-electric transducer 2 and the second magneto-electric transducer 6 can be composed of the magnetic core 8 and the coil 7 that is wound on the magnetic core 8, or the hall element 10.

Compared with the conventional current detector, in which the magneto-electric transducer detects the magnetic flux generated in the linear current path, the detection sensitivity of the current detector in Example 2 having the above-described configuration is improved similarly to the current detector in Example 1. Moreover, the density of the magnetic flux becomes high and homogeneous on each magnetic sensing surface of the first magneto-electric transducer 2 and the second magneto-electric transducer 6 in the current detector in Example 2. Accordingly, the detection sensitivity of the current detector in Example 2 is improved compared with the conventional current detector.

In Example 2, the first magneto-electric transducer 2 that detects the magnetic flux generated by the current to be detected I flowing in the first looped current path 3a is connected in series to the second magneto-electric transducer 6 that detects the magnetic flux generated by the current to be detected I flowing in the second looped current path 3b. Therefore, output of the first magneto-electric transducer 2 and output of the second magneto-electric transducer 6 are superimposed, thereby being approximately doubled. Consequently, the detection sensitivity of the current detector in Example 2 is further improved even more than the current detector in Example 1.

According to the current detector in Example 2, the first magneto-electric transducer 2 and the second magneto-electric transducer 6 obtain the same output with respect to an external uniform magnetic field. However, the first magneto-electric transducer 2 and the second magneto-electric transducer 6 are connected to each other to have the opposite polarity. Thus, the outputs of each magneto-electric transducer counteract mutually. As a result, interference of the external magnetic field can be avoided.

The first magneto-electric transducer 2 and the second magneto-electric transducer 6 have the magnetic sensing axes that are on the same axis. Therefore, mutual interference between the first magneto-electric transducer 2 and the second magneto-electric transducer 6 can be eliminated, thereby improving the detection sensitivity.

Figure 11:
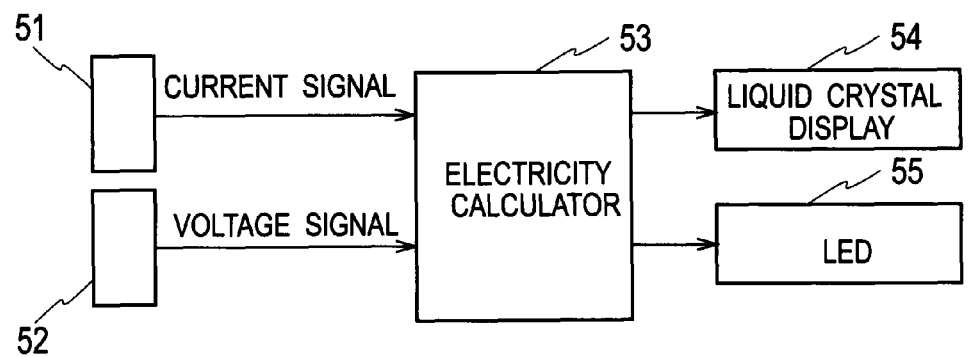
FIG. 11 is a block diagram illustrating a configuration of an electronic wattmeter using the current detector according to Example 1 or Example 2 of the present invention.

FIG. 11 is a block diagram illustrating a configuration of an electronic wattmeter using the current detector according to Example 1 or Example 2. The electronic wattmeter includes a current measurement unit 51, a voltage measurement unit 52, an electricity calculator 53, a liquid crystal display 54, and an LED (light-emitting diode) 55. The liquid crystal display 54 and the LED 55 correspond to an output unit of the electronic wattmeter of the present invention.

The current measurement unit 51 is composed of the current detector according to Example 1 or Example 2 described above. The current measurement unit 51 measures current flowing to the electronic wattmeter to transfer a current signal of the current to the electricity calculator 53. The voltage measurement unit 52 measures voltage applied to the electronic wattmeter to transfer a voltage signal of the voltage to the electricity calculator 53.

The electricity calculator 53 calculates electricity based on the current signal transferred from the current measurement unit 51 and the voltage signal transferred from the voltage measurement unit 52, and generates a pulse signal proportional to the calculated electricity so as to transfer to the liquid crystal display 54 and/or the LED 55. Accordingly, the electricity is displayed in the liquid crystal display 54 and/or the LED 55.

Industrial Applicability

The present invention is applicable to the electronic wattmeter.

The invention claimed is:
1. A current detector, comprising:
a U-shaped plate conductor composed of
a first conductor that is folded in one portion in a longitudinal direction to have two parts parallel to and facing each other having a predetermined width therebetween, so as to compose a first looped current path in the first conductor, and
a second conductor that is connected to the first conductor and folded in one portion in a longitudinal direction to have two parts parallel to and facing each other having a predetermined width therebetween, so as to compose a second looped current path in the second conductor;
a first magneto-electric transducer that is placed between the two parts of the first conductor so that a magnetic sensing axis is parallel to a width direction of the first conductor, of which a length in a direction of the magnetic sensing axis is smaller than the width of the first conductor; and
a second magneto-electric transducer that is placed between the two parts of the second conductor so that a magnetic sensing axis is parallel to a width direction of the second conductor, of which a length in a direction of the magnetic sensing axis is smaller than the width of the second conductor, the second magneto-electric transducer being connected in series to the first magneto-electric transducer,
wherein the magnetic sensing axes of the first magneto-electric transducer and the second magneto-electric transducer are on a same axis.
2. The current detector according to claim 1, wherein the second magneto-electric transducer is connected to the first magneto-electric transducer so that the second magneto-electric transducer has an opposite polarity to an polarity of the first magneto-electric transducer.
3. A wattmeter, comprising:
a current measurement unit that measures current;
a voltage measurement unit that measures voltage;
an electricity calculator that calculates electricity based on the current measured by the current measurement unit and the voltage measured by the voltage measurement unit; and
an output unit that outputs the electricity calculated by the electricity calculator,
wherein the current measurement unit comprises a current detector, the current detector comprising:
a U-shaped plate conductor composed of
a first conductor that is folded in one portion in a longitudinal direction to have two parts parallel to and facing each other having a predetermined width therebetween, so as to compose a first looped current path in the first conductor, and
a second conductor that is connected to the first conductor and folded in one portion in a longitudinal direction to have two parts parallel to and facing each other having a predetermined width therebetween, so as to compose a second looped current path in the second conductor;
a first magneto-electric transducer that is placed between the two parts of the first conductor so that a magnetic sensing axis is parallel to a width direction of the first conductor, of which a length in a direction of the magnetic sensing axis is smaller than the width of the first conductor; and
a second magneto-electric transducer that is placed between the two parts of the second conductor so that a magnetic sensing axis is parallel to a width direction of the second conductor, of which a length in a direction of the magnetic sensing axis is smaller than the width of the second conductor, the second magneto-electric transducer being connected in series to the first magneto-electric transducer, wherein the magnetic sensing axes of the first magneto-electric transducer and the second magneto-electric transducer are on a same axis.

4. The wattmeter according to claim 3, wherein the second magneto-electric transducer is connected to the first magneto-electric transducer so that the second magneto-electric transducer has an opposite polarity to a polarity of the first magneto-electric transducer.

* * * * *